(12) United States Patent
Bell et al.

(10) Patent No.: US 6,229,385 B1
(45) Date of Patent: May 8, 2001

(54) CONTROL FEATURE FOR IC WITHOUT USING A DEDICATED PIN

(75) Inventors: David B. Bell, Los Altos, CA (US); Samuel H. Nork, Andover, MA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 09/240,261

(22) Filed: Jan. 29, 1999

(51) Int. Cl.[7] .................................................. H01L 25/00
(52) U.S. Cl. ............................................. 327/565; 327/536
(58) Field of Search .................................... 327/536, 538, 327/540, 589, 565, 566, 544

(56) References Cited

U.S. PATENT DOCUMENTS

| | | | |
|---|---|---|---|
| 5,672,988 | 9/1997 | Nelson et al. | 327/108 |
| 5,812,017 | * 9/1998 | Golla et al. | 327/538 |
| 5,943,271 | * 8/1999 | Fujita | 327/536 |
| 5,959,854 | * 9/1999 | Okada | 327/536 |
| 6,041,011 | * 3/2000 | Umezawa et al. | 327/536 |

OTHER PUBLICATIONS

"500kHz and 1MHz High Efficiency 1.5A Switching Regulators," *Linear Technology Corporation Data Sheet*, LT1372/1377.

* cited by examiner

*Primary Examiner*—Jung Ho Kim
(74) *Attorney, Agent, or Firm*—Fish & Neave; Robert W. Morris; Stephen T. Straub (57) ABSTRACT

The present invention enables a pin on an integrated circuit to provide multiple duties. The internal circuit coupled to the selected pin is placed into a high impedance or sampling state based on a recurring signal so that the terminal pin can be sampled. The sampled signal is used to control the operation of the circuit, such as turning off the internal clock to place the circuit in shutdown mode. In that specific example, the integrated circuit exits shutdown mode when the sampled signal changes.

20 Claims, 8 Drawing Sheets

FIG. 4C ONE-SHOT B

FIG. 4B ONE-SHOT A

CONTROL FEATURE FOR IC WITHOUT USING A DEDICATED PIN

BACKGROUND OF THE INVENTION

This invention relates to implementing control features on an integrated circuit (IC). In particular, this invention relates to implementing a control feature on an IC without adding a dedicated pin to implement that feature.

The invention is described below as it applies to a charge pump circuit; however, persons skilled in the art will appreciate that the principles of the present invention can be applied to other integrated circuits as well. By enabling additional control features to be added to an IC without adding extra pins, the invention preserves valuable space on the circuit board.

Direct current to direct current (DC—DC) conversion circuits can be implemented using an inductor based topology or a capacitor based topology (e.g., a charge pump). Each type of converter topology has its own advantages and disadvantages. The inductor based topology requires fewer power switches and can be implemented in fewer pins than the capacitor based topology. For example, a conversion circuit that boosts voltage four times (a quadruplet) can be implemented with an inductor based topology using three pins, while a capacitor based topology requires a minimum of eight pins.

The inductor based topology, however, also has several disadvantages. These circuits are more complex to design than capacitor based topologies because they require numerous external components in addition to many internal IC controls. Moreover, they require magnetic energy storage, which often is difficult to stabilize and radiates EMI waves.

Capacitor based topology requires a minimum of eight power switches and eight pins to operate. Adding a control feature will normally increase the pin count to at least nine pins. To avoid increasing pin count and consuming additional space on the circuit board, the present invention enables the designer to add a control feature to the IC without requiring additional pins be added to the IC.

SUMMARY OF THE INVENTION

Accordingly, one of the objects of the invention is to enable additional control features to be added to an IC without adding additional dedicated pins.

The present invention provides an additional control feature to the IC by assigning multiple duties to one of the pins. In a preferred embodiment, a shutdown control feature is added to a quadrupler charge pump IC. Persons skilled in the art, however, will appreciate that the present invention can be utilized in various circuits, such as, for example, a doubler, a sextupler, an octupler, etc. charge pump IC or in any other IC where it is desirable to preserve a low pin count.

In accordance with the invention, a charge pump circuit that normally has two terminal pins attached thereto is provided with an operating and a sampling state. A timing circuit is used to provide a recurring signal, such as once every sixteen clock cycles, that places the charge pump into the sampling state for the duration of the recurring signal (normally one clock pulse). A sampler circuit then samples one of the doubler circuit's pins while the doubler circuit is in the sampling state. The control feature (e.g., shutdown) is implemented based on the sampled signal. For instance, the internal circuit clock can be disabled when there is an external pull-down signal on the sampled pin so that the IC is effectively shut down. The control feature also could be implemented with a external pull-up signal or any number of known control signals. Thus, a shutdown control feature is added to a charge pump IC without adding an additional dedicated pin. The sampled signal could be used to implement any number of different control features, such as modifying the regulator voltage, modifying the internal clock frequency or enabling an auxiliary function of the IC.

BRIEF DESCRIPTION OF THE DRAWINGS

The above and other objects and advantages of the invention will be apparent upon consideration of the following detailed description, taken in conjunction with the accompanying drawings, in which like reference numerals refer to like parts throughout.

DETAILED DESCRIPTION OF THE PREFERRED EMBODIMENTS

Figure 1:
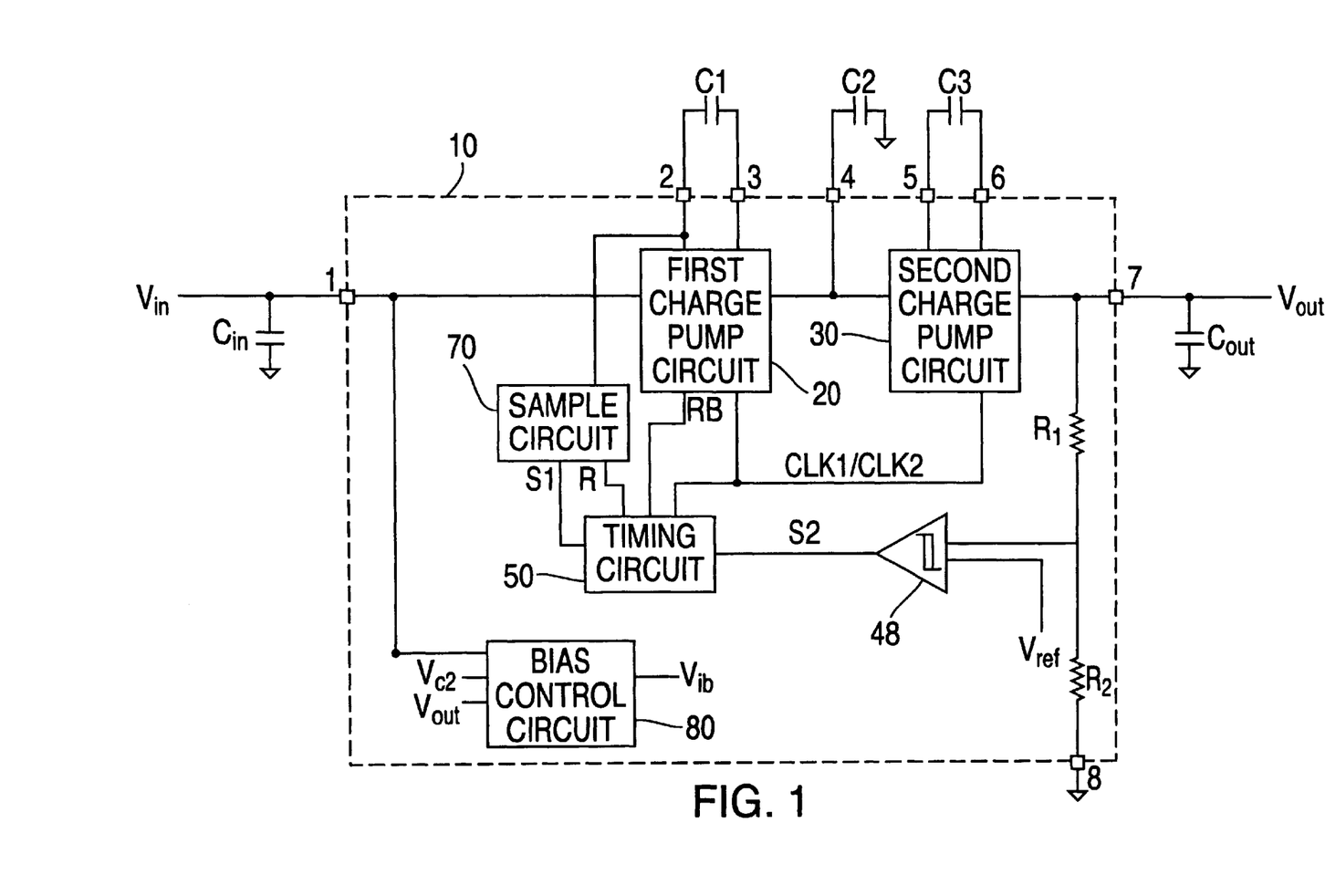
FIG. 1 is a block diagram of a quadrupler charge pump according to the present invention.

FIG. 1 shows a capacitor based quadrupler charge pump circuit 10 having terminal pins 1–8 coupled to input voltage $V_{in}$, output voltage $V_{out}$, external capacitors C1, C2, C3, $C_{in}$ and $C_{out}$, and ground GND.

Quadrupler charge pump IC 10 comprises first charge pump circuit 20, second charge pump circuit 30, comparator circuit 40, timing circuit 50, sample circuit 70, and bias control circuit 80. One of skill in the art would appreciate that the low voltage start-up feature described in U.S. Patent Application 09/240,102; entitled "IC With Enhanced Low Voltage Start Up", filed concurrently with the present application, can be added to this circuit; that application is herein incorporated by reference in its entirety.

Voltage $V_{in}$ is input to first charge pump circuit 20, which outputs a voltage approximately two times $V_{in}$ and stores that voltage on capacitor C2 as voltage $V_{C2}$. Voltage $V_{C2}$ is then input to second charge pump circuit 30 which outputs a voltage approximately two times voltage $V_{C2}$ as voltage $V_{out}$. Thus, output voltage $V_{out}$ is approximately four times input voltage $V_{in}$.

Compartor 40 regulates output voltage $V_{out}$ by comparing it to reference voltage $V_{ref}$. Comparator 40, shown in FIG. 1, disables timing circuit 50 via signal S2 when the divided down voltage $V_{out}$ is larger than reference voltage $V_{ref}$. Timing circuit 50 is disabled by turning the oscillator circuit, shown in FIG. 6, OFF when the output voltage is too high e.g., above the regulated range. Thus, output voltage $V_{out}$ is maintained within a predetermined range during operation of circuit 10.

Divider resisters R1, R2 are coupled to comparator 40 and $V_{out}$ and are chosen based on the voltage to which the circuit designer wants $V_{out}$ to be regulated. The values of resistors R1 and R2 also depend on the value chosen for reference voltage $V_{ref}$. For example if $V_{ref}$=1.2 volts and the desired $V_{out}$=3.3 volts, then the ratio of divider resistors R1:R2 should be 1.75:1. Any combination of resistors in that ratio will work, such as R1=2.1 Megohms and R2=1.2 Megohms.

Sample circuit 70, samples terminal pin 2 based on recurring signals R and RB generated in timing circuit 50. Sample circuit 70 then enables the control feature based on the signal input to terminal pin 2 during the sample interval. Timing circuit 50 also generates clock signals CLK1 and CLK2. These two circuits and their operation will be described below in more detail.

First and second charge pump circuits 20 and 30 operate as follows.

First charge pump circuit 20 is coupled to internal bias voltage $V_{ib}$, signal RB, two non-overlapping clock signals (signal CLK1 and signal CLK2), input voltage $V_{in}$ and external capacitor C1. Internal bias voltage $V_{ib}$ is generated in bias control circuit 80. Bias control circuit 80 selects the highest voltage from input voltage $V_{in}$, output voltage $V_{out}$ and voltage $V_{C2}$ to operate as $V_{ib}$. Clock signals CLK1 and CLK2 and signal RB are generated in timing circuit 50. These signals are used to control the first and second doublers, shown in FIG. 2 via the logic gates in FIGS. 3A and 3B, respectively. External capacitor C1 is coupled to first charge pump circuit 20 via terminal pins 2 and 3.

Figure 2:
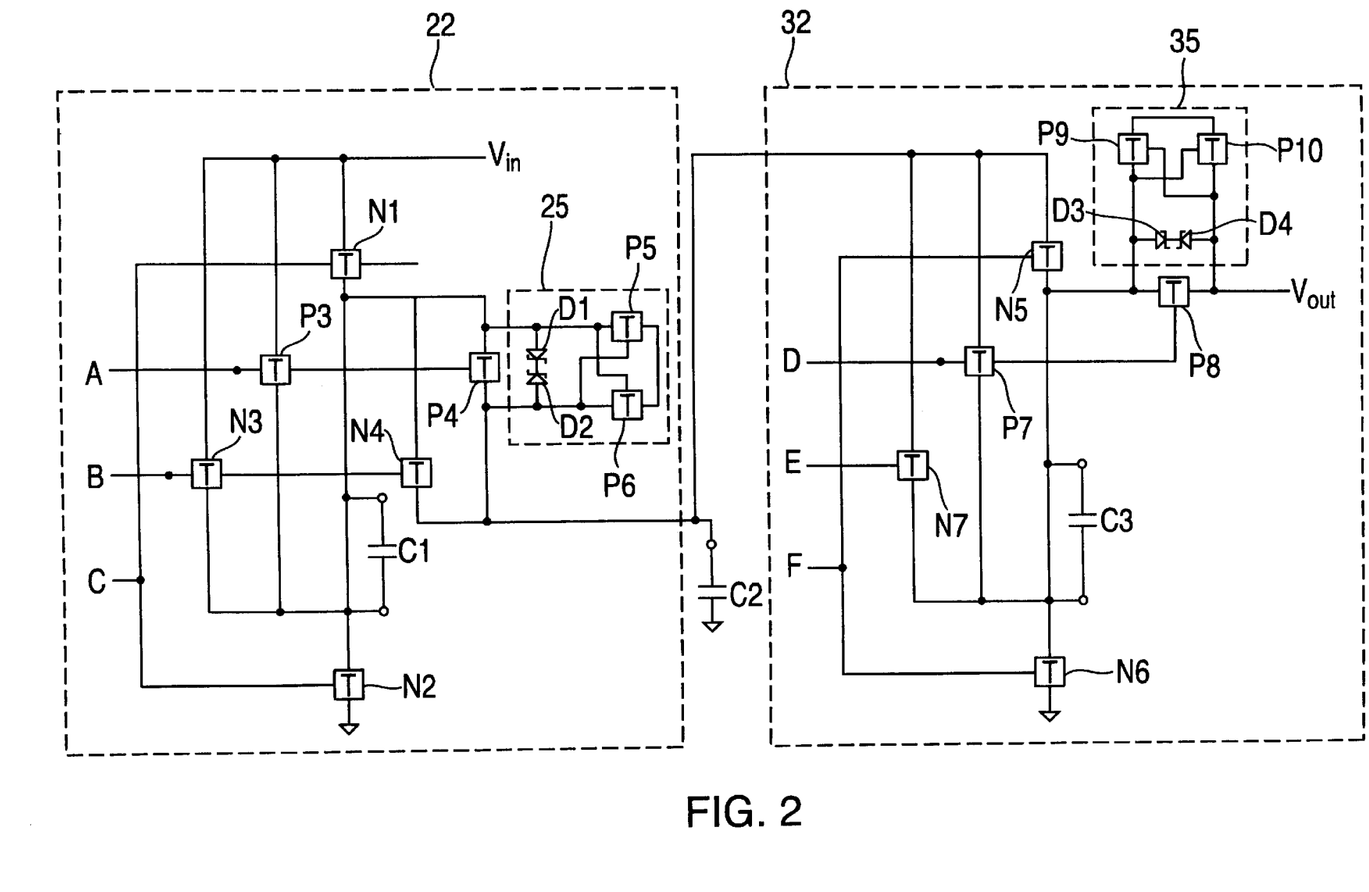
FIG. 2 is a circuit diagram of doubler circuits used to implement the charge pump circuit of FIG. 1.

Clock signals CLK1 and CLK2 control the transfer of charges to the capacitors by turning the power switches in the doubler circuits, shown in FIG. 2, ON and OFF at the appropriate time to effectively double the voltage input to each doubler. Input voltage $V_{in}$ is stored on capacitor C1 as voltage $V_{C1}$ when signal CLK1 pulses HIGH and signal RB is HIGH. Then, voltage $V_{C1}$ is summed with input voltage $V_{in}$ when signal CLK2 pulses HIGH and signal RB is HIGH. Thus, the voltage output from first charge pump circuit 20 is approximately two times the voltage input. The doubled voltage is stored on capacitor C2 as voltage $V_{C2}$ and then input to second charge pump circuit 30. Second charge pump circuit 30 works in essentially the same manner as first charge pump circuit 20, except capacitor C3 is used to store the interim voltage that is summed with voltage $V_{C2}$ during the second clock signal CLK2.

Figure 3A:
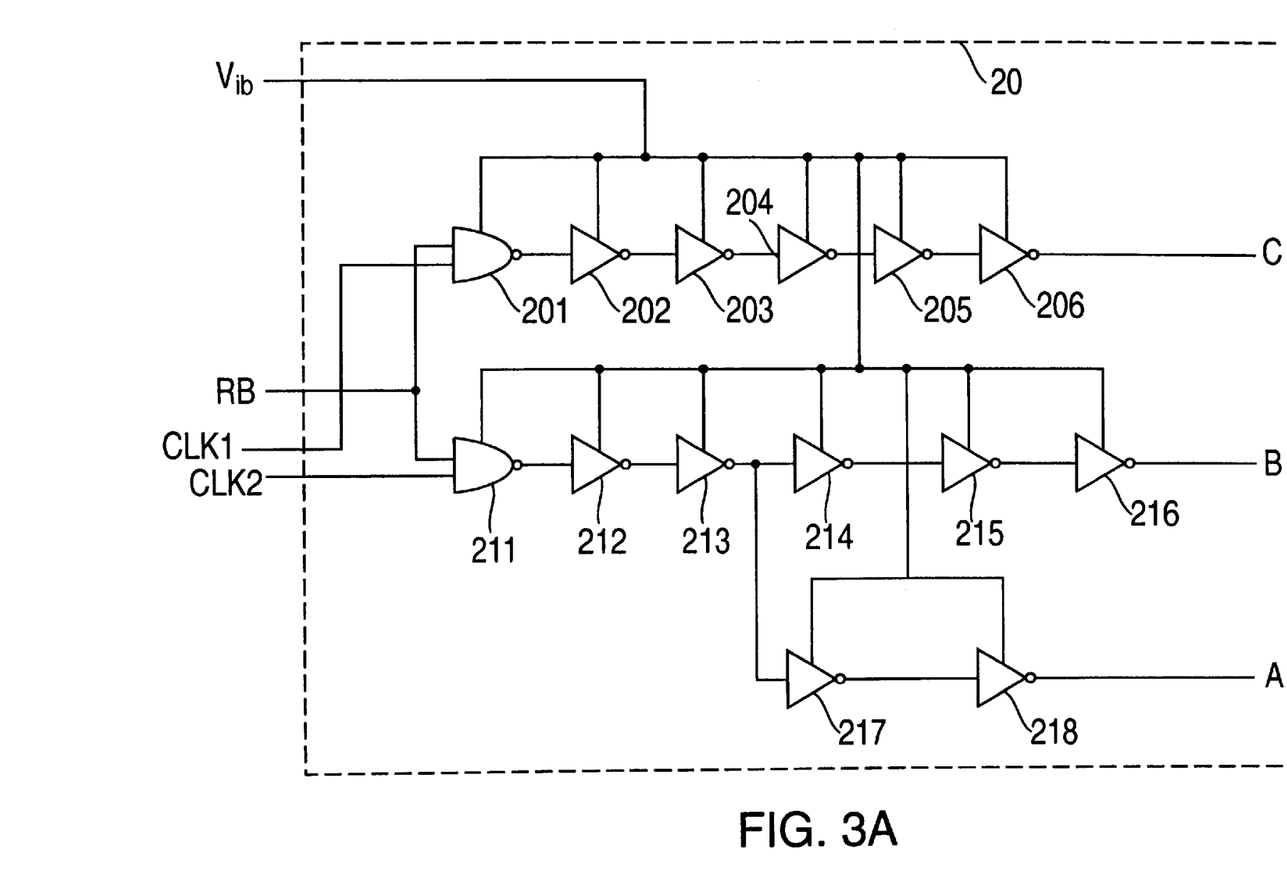
FIGS. 3A and 3B are circuit diagrams of the series of logic gates in the charge pump circuits of FIG. 1 used to generate control signals for each doubler circuit of FIG. 2.
Figure 3B:
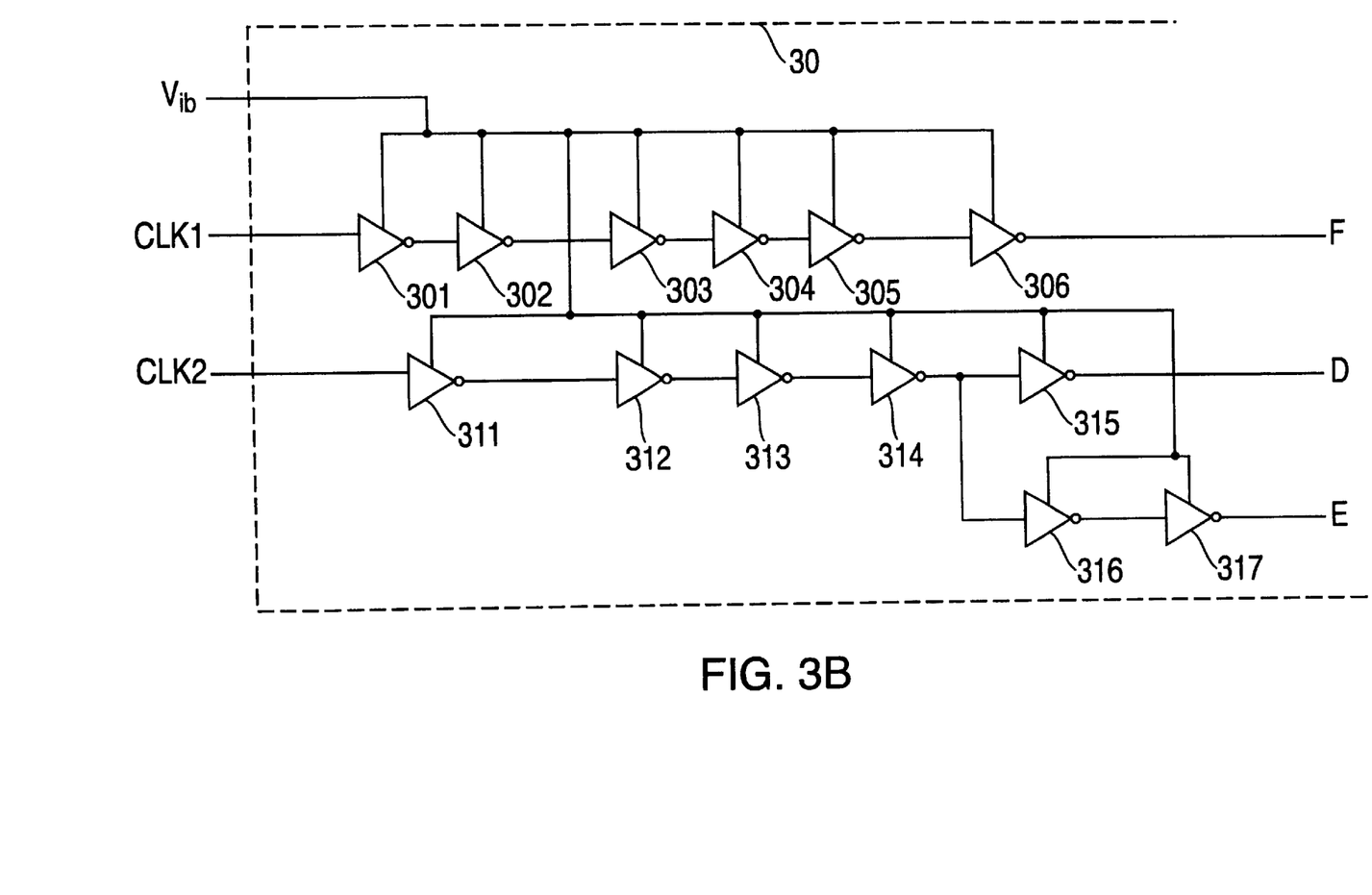

A circuit diagram of first and second charge pump circuits 20 and 30 are shown in FIGS. 2, 3A and 3B. First charge pump circuit 20 includes first doubler circuit 22, shown in FIG. 2, and logic gates 201–218, shown in FIG. 3A. Second charge pump circuit 30 includes second doubler circuit 32, shown in FIG. 2, and logic gates 301–317, shown in FIG. 3B.

As shown in FIG. 2, first doubler circuit 22 includes transistors N1, N2, N3, N4, P3, P4 and bias control circuit 25. Bias control circuit 25, which consists of transistors P5, P6 and Shottky diodes D1, D2, operates as a bias control for transistor P4. Signal A is coupled to transistors P3 and P4, signal B is coupled to transistors N3 and N4, and signal C is coupled to transistors N1 and N2. Throughout this application, transistors designated with a "N" prefix are preferably implemented as n-channel transistors, while those designated with a "P" prefix are preferably p-channel transistors.

Second doubler circuit 32 includes transistors N5, N6, N7, P7, P8 and bias control circuit 35. Bias control 35, which consists of Shottky diodes D3, D4 and transistors P9, P10, provides bias control to transistor P8. Signal D is coupled to transistors P7 and P8, signal E is coupled to transistor N7, and signal F is coupled to transistor N5 and N6.

The transistors in both doublers are preferably MOSFETs that operate as power switches. The particular details of the transistors, such as size and type are an engineering design choice. The transistors in the first and second doublers of FIG. 2 are controlled by signals A, B and C and signals D, E, and F supplied by the logic gates shown in FIGS. 3A and 3B, respectively.

As illustrated in FIG. 2, signal C turns transistors N1 and N2 ON when it is HIGH. Signal A turns transistors P3 and P4 ON when it is LOW and signal B turns transistors N3 and N4 ON when it is HIGH. Signal F turns transistors N5 and N6 ON when it is HIGH. Signal E turns transistor N7 ON when it is HIGH and signal D turns transistors P7 and P8 ON when it is LOW. The generation of these control signals A–F are described in more detail below.

As shown in FIG. 3A, control signals A, B, and C are generated from a series of logic gates 201–218 based on clock signals CLK1 and CLK2 and recurring signal RB, which operates as an override signal. Signals A, B, and C are used to turn ON and OFF the power switches in first doubler circuit 22, as described above. When signal RB is LOW it acts as an override signal to turn transistors N1–N4, P3–P4 OFF at the same time and, thus, place first doubler circuit 22 (and first charge pump circuit 20) in a high impedance state for sampling.

When signal RB is HIGH, signal CLK1 generates control signal C through invertor chains 202–206 and CLK2 generates signal B and A through invertor chains 212–216 and 212–213, 217–218, respectively. NAND gates 201, 211 help provide the correct polarity for the control signals and enable signal RB or CLK1/CLK2 to control the polarity of control signals A, B, and C. Thus, signal C is HIGH when CLK1 is HIGH, signal B is HIGH when CLK2 is HIGH and signal A is LOW when signal CLK2 is HIGH.

The polarity of control signals A, B, and C alternate because clock signals CLK1, CLK2 are non-overlapping, which enables first doubler circuit 22 to function properly without generating high throughput currents. This sequence causes $V_{in}$ to be stored on capacitor C1 during CLK1 and then $V_{in}$ to be combined with voltage $V_{C1}$ during CLK2 to effectively double the voltage.

The power switches in second doubler circuit 32 of FIG. 2 are controlled by the signals output from the logic gates shown in FIG. 3B, which work in a similar fashion to those described above for FIG. 3A, except that no override signal (RB) is provided to second charge pump circuit 30 in the described embodiment.

Control signals D, E, and F are generated by the series of logic gates shown in FIG. 3B from clock signals CLK1 and CLK2. Transistor N5 and N6 are turned ON by control signal F when signal CLK1 pulses HIGH, so that voltage $V_{C2}$ is stored on capacitor C3 as voltage $V_{c3}$. Transistor N7 is turned ON by signal E and transistors P7 and P8 are turned ON by signal D when CLK2 pulses HIGH, so that voltage $V_{C2}$ is summed with voltage $V_{C3}$. Thus, voltage $V_{out}$ is approximately four times voltage $V_{in}$.

As shown in FIG. 3B, invertor chains 301–306, 311–315, and 311–314, 317–318 work in the essentially the same fashion as described above with respect to the logic gates of FIG. 3A, except that no override signal RB is provided. Instead, the NAND gates from FIG. 3A are replaced with invertors (301, 311) to ensure that the correct polarities of signals D, E, and F are maintained. NAND gates are not required because there is no override signal for second charge pump circuit 30.

If the low voltage start-up feature described in U.S. Patent Application 09/240,102 (incorporated by reference above) is added to circuit 10, then invertors 301 and 311 are preferable replaced by NAND gates.

The invertors, shown in FIGS. 3A and 3B, may be progressively larger as the signal passes through each gate to provide better drive capability for the MOSFET transistors of the first and second doubler circuits shown in FIG. 2. The length of the invertor chains is a design choice as long as the polarity of the control signals is correct. Thus, the exact number and size of the invertors depends on various factors, such as die area and switching speed.

Figure 4A:
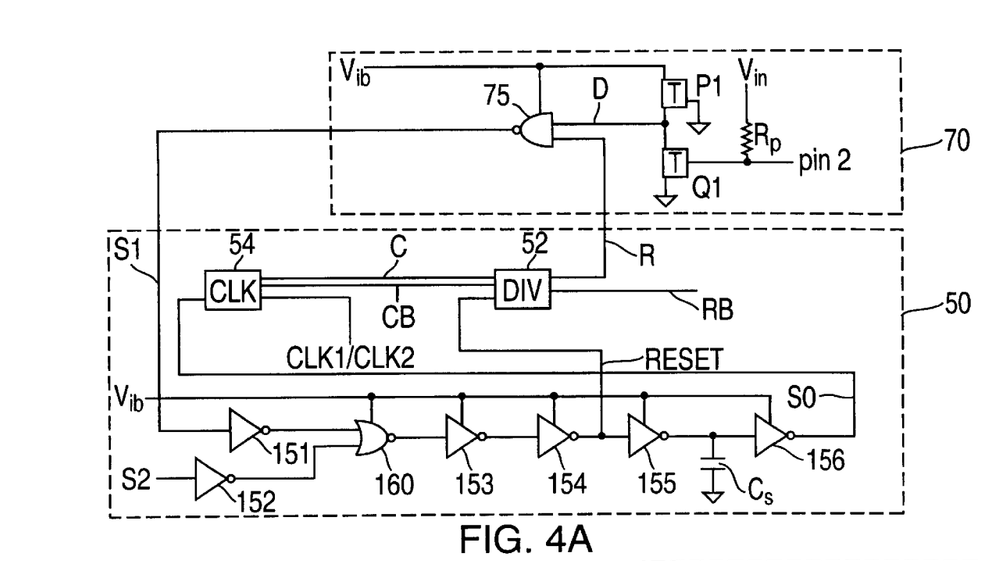
FIGS. 4A–C are circuit diagrams of the sampling circuit of FIG. 1 and a block diagram of the timing circuit of FIG. 1 according to the invention.
Figure 4B:
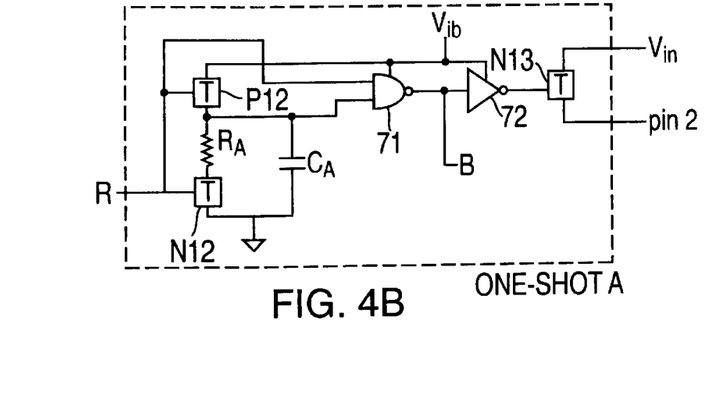
Figure 4C:
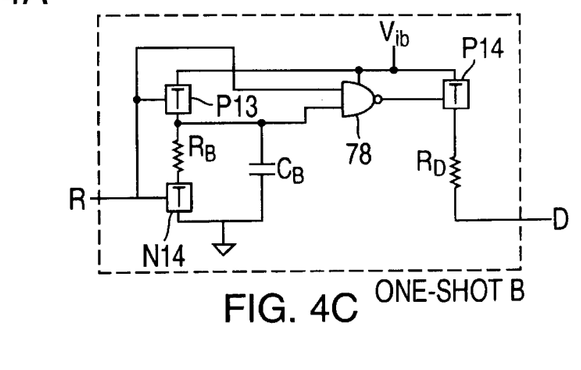

Sample circuit 70 and its connections to timing circuit 50 are shown in FIGS. 4A to 4C. As shown in FIG. 4A, timing circuit 50 supplies recurring signal R to sample circuit 70 and sample circuit 70 provides signal S1 to timing circuit 50. When signal R is HIGH, it triggers sample circuit 70 so that the signal on pin 2 is sampled and signal S1 is output based on signal D which is determined by the sampled signal. When signal S1 is forced LOW, it disables clock generator circuit 54 and thus timing circuit 50 via signal SO. When signal R is LOW, the output of NAND gate 72 (signal S1) is always HIGH, so timing circuit 50 is not disabled by that signal.

Sample circuit 70 comprises NAND gate 75, resistor $R_p$, transistors Q1 (n-channel) and P1, One-Shot A (FIG. 4B) and One-Shot B (FIG. 4C). One-Shot A is coupled in parallel to resistor $R_p$ to provide boost current to the pull-up current generated across resistor $R_p$. One-Shot B is coupled in parallel to transistor P1 to provide a boost to the pull-up current generated at node D.

As shown in FIG. 4B, One-Shot A comprises transistors N12, N13 and P12, resistor $R_A$, capacitor $C_A$, and logic gates 71–72. As shown in FIG. 4C, One-Shot B comprises transistors N14, P13 and P14, resistors $R_B$ and $R_D$, capacitor $C_B$, and NAND gate 78.

As discussed above, signal RB forces first charge pump circuit 20 into a high impedance state when signal RB is LOW to allow the voltage on pin 2 to be sampled by sample circuit 70. If there is no external pull-down present on pin 2 during the sampling interval, then One-Shot A pulls pin 2 to $V_{in}$ via $R_p$. Thus, transistor Q1 remains ON and signal D remains LOW, so that the output of NAND gate 75 (signal S1) is HIGH and clock generator circuit 54 in timing circuit 50 stays enabled. One-Shot B is activated after One-Shot A via signal B, which is output from NAND gate 71, shown in FIG. 4B. One-Shot B tries to force transistor Q1 into its OFF state, but transistor Q1 overpowers One-Shot B when there is no external pull-down present and thus stays ON so that signal S1 remains HIGH.

If there is an external pull-down present on pin 2 when it is sampled, then One-Shot A cannot pull pin 2 high because the external pull-down overpowers One-Shot A and keeps pin 2 LOW (i.e., pulled to ground). Therefore, transistor Q1 will be turned OFF. After One-Shot B is activated by signal B, it drives transistor P1 which forces signal D HIGH since transistor Q1 is turned OFF. Since signal D is HIGH and signal R is HIGH, signal S1 from NAND gate 75 is LOW and clock generator circuit 54 in timing circuit 50 is disabled.

When clock generator circuit 54 in timing circuit 50 is disabled, signals CLK1 and CLK2 are not generated and the first and second charge pumps are functionally shut down.

Figure 5:
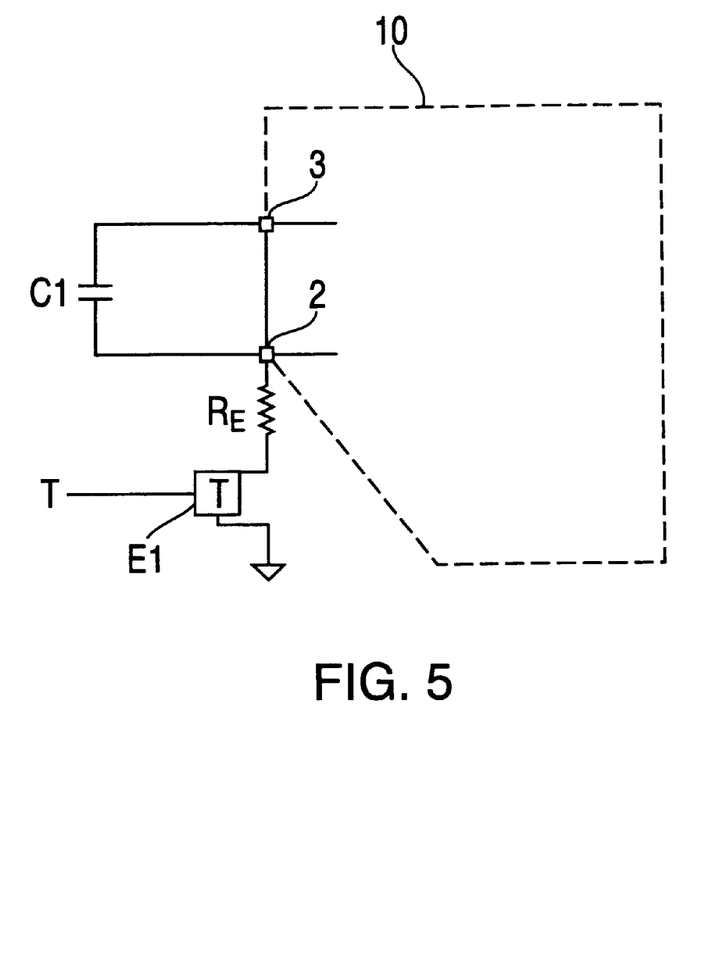
FIG. 5 is a diagram of a circuit that provides an external pull-down signal to the circuit of FIG. 1.

Timing circuit 50 stays disabled until the external pull-down is removed from pin 2. When the external pull-down is removed, resistor $R_p$ provides a weak pull-up current which turns transistor Q1 back ON. The pull-up current provided across resistor $R_p$ cannot turn transistor Q1 ON when the external pull-down is present because resistor $R_E$ used in the external pull-down circuit, shown in FIG. 5, is much smaller than resistor $R_p$. Therefore, any current generated across resistor $R_p$ flows to ground via the external pull-down circuit when it is activated.

When signal R is HIGH, One-shot A, shown in FIG. 4B, provides additional current boost to the pull-up current across resistor $R_p$, since the current generated by resistor $R_p$ is too weak to slew internal capacitances by itself during the sampling interval. One-Shot A is an n-channel one shot which enables a faster and harder switching than a p-channel one shot, such as One-Shot B. One-Shot B is designed so that it cannot overpower transistor Q1 during the sampling interval without the help of the external pull-down signal. These one shots are not required to implement the invention because the pull-up currents could be made larger; however, that would increase the quiescent current of the device which is not preferable.

As shown in FIG. 4B, signal R activates One-Shot A when it is HIGH. If signal R is HIGH, then transistor P12 is turned OFF and transistor N12 is turned ON, so that capacitor $C_A$ discharges through resistor $R_A$ to force the output of NOR gate 71 (signal B) LOW for the duration of the discharge. The duration of the discharge is defined by the ratio of $R_A$ to $C_A$ (e.g., 300 nsec), which can be adjusted as needed. Thus, transistor N13 is turned ON when signal B is LOW and pin 2 is pulled to $V_{in}$ to keep transistor Q1 ON during the sampling period, unless there is an external pull-down present. If there is an external pull-down present, then One-Shot A cannot overcome the external signal and pull pin 2 to $V_{in}$, so transistor Q1 is turned OFF, as described above.

When signal R is LOW, transistor N12 is OFF and transistor P12 is ON, thus the output of NAND gate 71 is forced HIGH and the output of invertor 72 is LOW so that transistor N13 is OFF and pin 2 is not pulled to $V_{in}$ via transistor N13. During this period of time, pin 2 is used by first charge pump 20 to double $V_{in}$, as described above.

As shown in FIG. 4C, One-Shot B provides additional current boost to the pull-up current at node D when it is activated. One-Shot B is rising-edge triggered and is activated by signal B from One-Shot A. When signal R is HIGH, signal B transitions from LOW to HIGH as capacitor $C_A$ is discharged across resistor $R_A$. One-Shot B is activated based on this transition as signal B becomes HIGH. One-Shot B is designed as a p-channel one shot to attempt to pull voltage D to voltage $V_{ib}$ when One-Shot B is activated.

When signal B is HIGH, transistor N14 is ON and transistor P13 is OFF, so that capacitor $C_B$ discharges across resistor $R_B$. The output of NAND gate 78 remains LOW for the duration of this discharge which turns transistor P14 ON and attempts to pull voltage D to voltage $V_{ib}$. Resistor $R_D$ is provided to weaken the pull-up current at node D. Signal D will remain LOW as long as transistor Q1 is ON, since transistor Q1 can sink all of the current generated by One-Shot B. Of course, if transistor Q1 is turned OFF, then voltage D is pull-up to voltage $V_{ib}$ and the circuit operates as described above.

One-Shot B is only activated on a rising edge of signal B, so no pull up current is generated across resistor $R_D$ when signal B is LOW or when signal B has been high longer than the time defined by the ratio of capacitor $C_B$ to resistor $R_B$.

One goal of using these one shots is to keep the pull-up currents low during sampling so that current is not wasted by being drained to ground across the external pull-down circuit, shown in FIG. 5. The weak internal pull-up currents combined with the one shot current boosts during critical times enable the circuit to have a low quiescent current while in the shutdown state.

As shown in FIG. 5, the external pull-down signal is supplied by MOSFET transistor E1 (n-channel) and pull-down resistor $R_E$. If transistor E1 is turned ON by signal T, then resistor $R_E$ causes pin 2 to be pulled LOW (i.e., to ground) across transistor E1, which causes signal S1 to become HIGH and thus disables clock generator circuit 54 so that signals CLK1 and CLK2 are not produced. When pin 2 is pulled LOW during the sampling interval, the internal clock of circuit 10 is disabled and circuit 10, including first charge pump circuit 20 and second charge pump circuit 30 are shut down until the external pull-down is removed.

Figure 6:
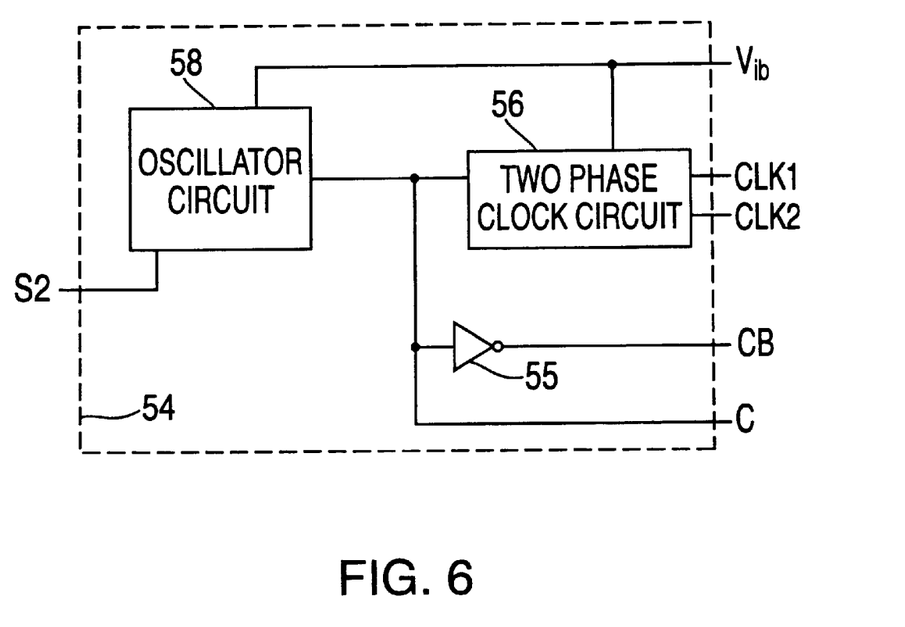
FIG. 6 is a block diagram of a clock generation circuit that can be used to provide clock signals to the circuits of FIGS. 3A, 3B and 4A.
Figure 7:
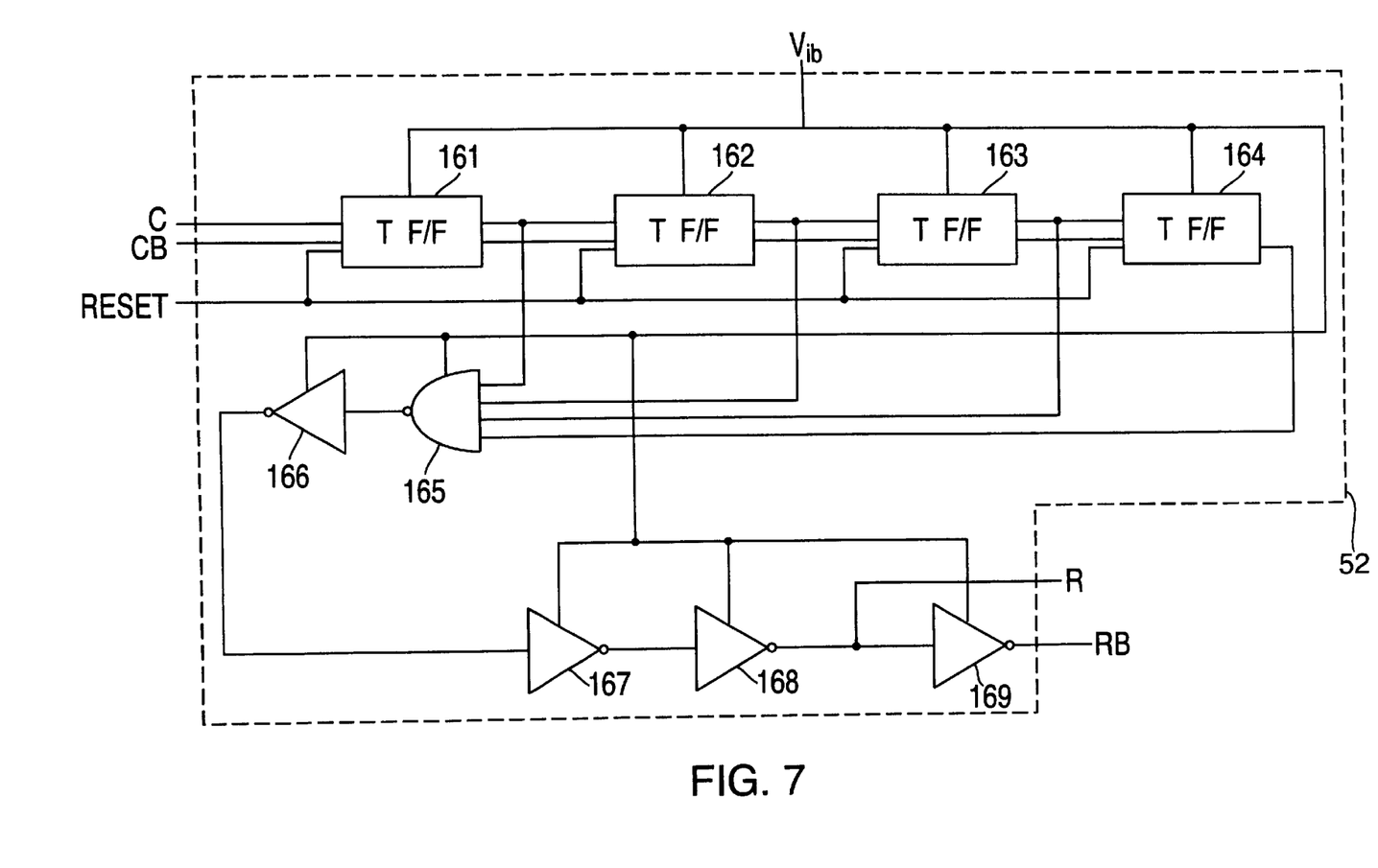
FIG. 7 is a block diagram of a flip-flop circuit used to generate the recurring signals (R and RB) of FIGS. 1–6.

Timing circuit 50, shown in FIG. 4A, comprises invertors 151–156, NOR gate 160, capacitor $C_S$, clock generator circuit 54 (shown in FIG. 6) and divider circuit 52 (shown in FIG. 7). Logic gates 151–156, 160 and capacitor $C_S$ serve as a delay circuit and produce signals SO and RESET. Signal RESET clears the counters in divider 52. Signal SO is delayed by two invertors and $C_S$ (compared to signal RESET) to ensure that the divider 52 is reset before clock generator circuit 54 begins creating pulses. Therefore, all of the pulses are counted by divider circuit 52 and the generation of recurring signals R and RB can be accurately controlled.

Timing circuit 50 can be turned OFF (i.e., disabled) by signal S1 from sample circuit 70 or by signal S2 from comparator 40, as described above. NOR gate 160 allows timing circuit 50 to be controlled by either signal S1 or S2.

The block diagram in FIG. 6 illustrates one possible configuration of clock generator circuit 54. In FIG. 6, clock generator circuit 54 is comprised of two phase clock generator circuit 56 and oscillator circuit 9. Any circuit capable of generating an oscillating wave (signal C) can be used as oscillator circuit 58. Oscillator circuit 58 also generates clock bar signal CB via invertor 55. Signals C and CB are used as timing signals for the generation of signals R, RB, as shown in FIG. 7. Toggle flip-flops 161–65, shown in FIG. 7, cannot tolerate significant non-overlap in signals C and CB or they will generate false pulses and the count provided by the flip-flops will be wrong.

Signal C is also input to two phase clock generator circuit 56, which creates non-overlapping clock signals CLK1 and CLK2 from oscillating signal C. Clock signals CLK1 and CLK2 must be non-overlapping to avoid the generation of large flow through currents in the doublers. Several ways of creating these two non-overlapping clock signals are known in the art and any of them can be used in the implementation of the invention.

As shown in FIG. 7, divider circuit 52 is comprised of four toggle flip-flops 161–64 and logic gates 165–169. Four toggle flip-flops 161–164 are used to generate recurring signals R and RB once every 16 clock pulses. Each toggle flip-flop acts to cut the frequency of the clock signals in half, thus using four flip-flops causes recurring signals R and RB to be generated once every 16 pulses ($2^4$=16). NAND gate 165 provides a low pulse every 16 cycles when its four inputs are all HIGH at the same time. Thus, signal R becomes HIGH and signal RB becomes LOW based on the output of invertors 166–169.

Since recurring signal RB places first charge pump circuit 20 into an OFF state when it is LOW, as described above, it is preferably not generated too often. However, pin 2 must be checked with some frequency, so recurring signals R and RB must be generated regularly. Therefore, an engineering compromise is reached and the sampling in charge pump 10 is preferably conducted every 16 cycles. Though recurring signals R and RB could also be generated every 8, 32 or some other number of clock cycles based on design choices.

The operation and design of toggle flip-flops are known in the art. Other known methods of dividing a clock signal can be used in the invention to generate a signal periodically.

The preferred embodiment is described above with respect to a charge pump circuit; however, the present invention can be used on any circuit with an internal clock to limit the number of pins necessary to implement extra control features in the circuit. Further, the sampled control signal could be implemented as a pull-up or any other designated signal and is not limited to an external pull-down. Persons skilled in the art will appreciate that the present invention can be practiced by other than the described embodiments, which are presented for purposes of illustration and not of limitation, and the present invention is limited only by the claims which follow.

We claim:

1. An integrated circuit having a multiple duty pin, comprising:

an internal circuit attached to the multiple duty pin, the internal circuit set from an operate state to a sample state based on a signal internal to the integrated circuit; and a sampler circuit which samples the multiple duty pin for an input signal supplied by a source external to the integrated circuit when the internal circuit is set to the sample state to enable a control feature for the integrated circuit without adding a dedicated pin.

2. The circuit according to claim 1, further comprising a clock circuit, which is disabled based on the sampled signal to place the integrated circuit into a shutdown mode.

3. The circuit according to claim 2, wherein the signal which sets the internal circuit to the sample state is generated on a predetermined schedule.

4. The circuit according to claim 3, wherein the predetermined schedule is a set period of time.

5. The circuit according to claim 1, wherein the internal circuit is a charge pump.

6. The circuit according to claim 2, wherein the clock circuit is enabled when the sampled signal crosses a set threshold.

7. The circuit according to claim 6, wherein the internal circuit remains in the sample state until the clock circuit is enabled.

8. The circuit according to claim 2, wherein the sampled signal used to disable the clock circuit is an external pull-down signal.

9. The circuit according to claim 2, wherein the sampled signal used to disable the clock circuit is an external pull-up signal.

10. The circuit according to claim 2, wherein the clock circuit generates a plurality of non-overlapping clock signals.

11. The circuit according to claim 1, wherein the control feature is selected from the group of shutdown, modifying a regulator voltage, modifying the internal clock frequency and enabling an auxiliary function of the integrated circuit.

12. The circuit according to claim 1, wherein the sample state of the internal circuit is a high impedance state.

13. An integrated circuit with a control feature, comprising:
- a charge pump having at least a doubler circuit, the doubler circuit having operate and sample states, and first and second terminals;
- a timing circuit for setting the doubler circuit from the operate state to the sample state based on a recurring signal; and
- a sampler circuit for sampling one of the first or second terminals when the doubler circuit enters the sample state and enabling the control feature of the integrated circuit when a selected external input signal from a source external to the integrated circuit is present on the sampled terminal.

14. The circuit according to claim 13, wherein the control feature of the integrated circuit is implemented by the sampler circuit disabling the timer circuit of the integrated circuit.

15. The circuit according to claim 13, wherein the control feature is a shutdown control feature.

16. An integrated circuit that operates as a quadrupler charge pump and is capable of performing at least one control function, the integrated circuit having at most eight terminals and comprising:
- a quadrupler charge pump circuit including a first pump circuit and a second pump circuit, the first pump circuit having operate and sample states;
- at most eight terminals including an input terminal for receiving an input, a ground terminal, first and second terminals coupled to the first pump circuit, third and fourth terminals coupled to the second pump circuit, a fifth terminal coupled to an output of the first pump circuit, to an input of the second pump circuit and to an external storage capacitor, and an output terminal;
- a timing circuit for setting the first pump circuit from the operate state to the sample state based on a recurring clock signal; and
- a sampler circuit for sampling one of the first and second terminals for an input signal from a source external to the integrated circuit when the first pump circuit enters the sample state and causing the operation of the control function of the integrated circuit based on the input signal present on the sampled terminal.

17. The circuit according to claim 16, wherein the control function of the integrated circuit is implemented by the sampler circuit causing the disablement of the timing circuit based on the sampled signal to place the integrated circuit into a shutdown mode.

18. The circuit according to claim 16, wherein the circuit is placed into a shutdown mode when an external pull-down signal is present on the sampled terminal.

19. An integrated circuit that operates as a quadrupler charge pump and performs at least one control function with eight terminals, the circuit comprising:
- a quadrupler charge pump circuit including a first pump circuit and a second pump circuit, the first pump circuit having operate and sample states;
- at least an input terminal for receiving an input, a ground terminal, first and second terminals coupled to the first pump circuit, third and fourth terminals coupled to the second pump circuit, a fifth terminal coupled to the first pump circuit, to the second pump circuit and to an external storage capacitor, and an output terminal;
- a timing circuit for setting the first pump circuit from the operate state to the sample state based on a recurring signal; and
- a sampler circuit for sampling one of the first and second terminals for an input signal from a source external to the integrated circuit when the first pump circuit enters the sample state and causing the operation of the integrated circuit's control function based on the input signal present on the sampled terminal;
- wherein the input, output, ground and first through fifth terminals collectively require connection to no more than eight different nodes among external components used to implement the quadrupler charge pump circuit with an extra control function.

20. The circuit according to claim 19, wherein the integrated circuit's control function operates when an external pull-down signal is present on the sampled terminal by disabling the timing circuit to place the integrated circuit into a shutdown mode.

* * * * *